(12) United States Patent
Findeisen

(10) Patent No.: US 11,835,112 B2
(45) Date of Patent: Dec. 5, 2023

(54) TWO-AXIS ROTATOR

(71) Applicant: HELMHOLTZ-ZENTRUM DRESDEN-ROSSENDORF E.V., Dresden (DE)

(72) Inventor: Stefan Findeisen, Dresden (DE)

(73) Assignee: HELMHOLTZ-ZENTRUM DRESDEN-ROSSENDORF E.V., Dresden (DE)

( * ) Notice: Subject to any disclaimer, the term of this patent is extended or adjusted under 35 U.S.C. 154(b) by 0 days.

(21) Appl. No.: 17/905,338

(22) PCT Filed: Mar. 3, 2021

(86) PCT No.: PCT/EP2021/055264
§ 371 (c)(1),
(2) Date: Aug. 31, 2022

(87) PCT Pub. No.: WO2021/175893
PCT Pub. Date: Sep. 10, 2021

(65) Prior Publication Data
US 2023/0167879 A1 Jun. 1, 2023

(30) Foreign Application Priority Data
Mar. 3, 2020 (DE) ..................... 10 2020 105 671.0

(51) Int. Cl.
*F16H 1/22* (2006.01)
*F16M 11/12* (2006.01)
(Continued)

(52) U.S. Cl.
CPC .............. *F16H 1/225* (2013.01); *B01L 3/505* (2013.01); *B01L 3/508* (2013.01);
(Continued)

(58) Field of Classification Search
CPC .......... F16H 1/225; F16M 11/12; F16M 11/18
(Continued)

(56) References Cited

U.S. PATENT DOCUMENTS

2013/0125690 A1\* 5/2013 Long ...................... B25J 9/0024
74/423
2017/0336700 A1 11/2017 Liu

FOREIGN PATENT DOCUMENTS

CN 205781776 U \* 12/2016
CN 108381542 A \* 8/2018
(Continued)

OTHER PUBLICATIONS

Written Opinion of the International Searching Authority for International Application No. PCT/EP2021/055264, dated May 18, 2021.

*Primary Examiner* — Stephanie E Bloss
*Assistant Examiner* — Kevin C Butler
(74) *Attorney, Agent, or Firm* — Robinson IP Law, PLLC

(57) ABSTRACT

The invention relates to a two-axis rotator for producing a rotation about two orthogonal spatial axes, and to a handling device comprising a two-axis rotator of this kind. The two-axis rotator for producing a rotation about two mutually orthogonal rotational axes comprises a main body, a first rotor and a second rotor, wherein the first rotor is mounted on or in the main body so as to be able to rotate about a first rotational axis, and the second rotor is mounted on or in the first rotor so as to be able to rotate about a second rotational axis, and wherein the first rotor has a first drive and the second rotor has a second drive, and the first drive and the second drive can be driven independently of one another.

15 Claims, 2 Drawing Sheets

(51) Int. Cl.
*F16M 11/18* (2006.01)
*B01L 3/00* (2006.01)
*G01N 23/2204* (2018.01)
*H01J 37/20* (2006.01)

(52) U.S. Cl.
CPC .......... *B01L 3/50825* (2013.01); *F16M 11/12* (2013.01); *F16M 11/18* (2013.01); *G01N 23/2204* (2013.01); *H01J 37/20* (2013.01)

(58) Field of Classification Search
USPC ..................................................... 73/864.91
See application file for complete search history.

(56) References Cited

FOREIGN PATENT DOCUMENTS

| | | | | |
|---|---|---|---|---|
| DE | 3304582 A | * | 8/1984 | |
| DE | 102011082008 | | 3/2013 | |
| DE | 102011082008 A1 | * | 3/2013 | |
| DE | 102012002728 | | 8/2013 | |
| DE | 102012002728 A1 | * | 8/2013 | |
| DE | 102012210638 A1 | * | 12/2013 | |
| DE | 268534 A1 | * | 1/2020 | ............. G02B 27/28 |
| DE | 202021102762 U1 | * | 8/2021 | ............... G12B 1/00 |
| WO | WO-2021175893 A1 | * | 9/2021 | |

* cited by examiner

TWO-AXIS ROTATOR

CROSS-REFERENCE TO RELATED APPLICATIONS

This application claims priority to and is a U.S. National Phase application of international patent application number PCT/EP2021/055264 for a "Two-Axis Rotator" filed on Mar. 3, 2021, which claims priority to German patent application number 102020105671.0 filed on Mar. 3, 2020, the contents of which are incorporated herein by reference in their entireties.

BACKGROUND

Positioning devices with a rotation axis are available from commercial suppliers for analytical measurement methods in extremely high magnetic fields and cryogenic temperatures. However, it is not thereby possible to adjust any desired orientations with respect to material samples to be examined, whereby, on the one hand, residual incorrect orientations with respect to the desired orientation are inevitable and, on the other hand, complete examinations of angle-dependent sample properties cannot be carried out.

Known two-axis rotators, which are used in the sector of solid state physics, enable either no simultaneous driving of the two rotation axes or only a very limited angular range for the sample rotation. As a result of a limited angular range, no desired orientations of material samples to be examined can be adjusted, whereby, on the one hand, residual incorrect orientations with respect to the desired orientations have to be accepted and, on the other hand, specific examinations of angle-dependent sample properties are in principle excluded. In particular, in solutions which enable no simultaneous driving of both axes, a completely automated measurement of angle-dependent properties is not possible.

SUMMARY

The invention relates to a two-axis rotator, that is to say, a device which enables a rotation to be produced about two orthogonal spatial axes, and a handling apparatus having such a two-axis rotator and an analysis apparatus for analyzing properties of an object to be examined having such a two-axis rotator and/or having such a handling apparatus.

The invention generally relates to apparatuses for handling objects of any type and size.

In specific embodiments, the invention relates to apparatuses for angular positioning of material samples to be examined during the use of various analytical measurement methods, that is to say, for defined spatial arrangement of such material samples in the active region of scientific/technical analysis or measuring devices or of energy fields which are produced by or in such devices.

Such methods comprise, for example, the examination of electronic sample properties under extreme environmental conditions, such as very powerful magnetic fields and/or extremely low cryogenic temperatures, also and in particular with at the same time highly limited sub-assembly volumes. Representative examples are in this instance nuclear magnetic resonance, the measurement of electronic transport variables, such as the electrical resistance or the thermal conductivity, the specific heat, magnetic alternating field susceptibility, etcetera, or examinations using ultrasound, neutron or X-ray radiation, etcetera. The analytical methods mentioned are used worldwide in various laboratory environments in the research sector of basic and application-orientated solid-state physics and material science.

An object of the invention is to provide improved apparatuses for handling objects of any type and size, which enable an angular positioning, that is to say, a defined spatial arrangement of an object, wherein a rotation about at least two orthogonal spatial axes can be controlled independently of each other.

This object is achieved with a two-axis rotator having the features of patent claim 1 and a handling apparatus having the features of patent claim 10. Advantageous embodiments and developments are set out in the dependent claims.

The proposed two-axis rotator for producing a rotation about two mutually orthogonal rotation axes comprises a base member, a first rotor and a second rotor, wherein the first rotor is rotatably supported in or on the base member about a first rotation axis and the second rotor is rotatably supported on or in the first rotor about a second rotation axis, and wherein the first rotor has a first drive and the second rotor has a second drive, and the first drive and the second drive can be driven independently of each other.

In specific embodiments of the proposed two-axis rotator, there may be provision for the first rotor to have a cylindrical inner face and the second rotor to have a cylindrical outer face and for the inner face and the outer face to cooperate as rotary bearings, wherein the center axes thereof define the second rotation axis. In this manner, the required relative rotatability is solved between the first rotor and the second rotor in a mechanically simple manner and without additional rotary bearings.

In specific embodiments of the proposed two-axis rotator, there may be provision for the first rotor to have two shaft ends which are arranged opposite each other in alignment and whose center axes define the first rotation axis. These shaft ends may be used directly to rotatably support the first rotor on or in the base member, for which no separate rotary bearings are required. The shaft ends may, for example, be in the form of shaft stubs.

In specific embodiments of the proposed two-axis rotator, there may be provision for a first hollow shaft to be arranged in a rotationally secure manner at a first shaft end. In order to bring about a rotation of the first rotor, in this case the first hollow shaft is rotated, and, as a result of its rotationally secure fitting to the shaft end, brings about a corresponding rotation of the first rotor.

In specific embodiments of the proposed two-axis rotator, there may be provision for a second shaft end to have a cylindrical outer face and for a second hollow shaft having a cylindrical inner face to be arranged on the second shaft end, wherein the inner face and the outer face cooperate as rotary bearings, wherein the second hollow shaft is rotatably supported on or in the base member about the first rotation axis and the first rotor is rotatably supported in the second hollow shaft about the first rotation axis. In this instance, the second hollow shaft is a mechanically active member which is arranged between the base member and the first rotor. In this instance, the second hollow shaft can be rotated relative to the base member as well as relative to the first rotor.

In specific embodiments of the proposed two-axis rotator, there may be provision for the shaft ends or the hollow shafts to have a drive gearing in each case. In other words, a drive gearing may be fitted directly on or to the shaft ends. Alternatively, when the above-mentioned hollow shafts are arranged on the shaft ends, the respective drive gearing may be fitted on or to the hollow shafts. This may have advantages during production, but may at the same time also facilitate the replacement of a defective gearing.

According to an embodiment, at least one shaft end or at least one hollow shaft or at least one drive gearing may be operationally connected to a worm gear drive. This includes embodiments in which both shaft ends, hollow shafts or drive gearings are operationally connected to a worm gear drive in each case. The driving via worm gear drives is, however, not absolutely necessary, but instead represents only an advantageous embodiment of the proposed two-axis rotator. The redirection of the rotational movements brought about by means of worm gear drives is also not absolutely necessary. In other embodiments of the invention, a redirection of the rotational movements can also be carried out in a different manner or the shaft ends or the hollow shafts are driven directly if the structural space allows.

In specific embodiments of the proposed two-axis rotator, there may be provision for the worm gear drives to be arranged parallel with each other. This configuration is particularly advantageous since it considerably simplifies the driving of the worm gear drives, in particular in confined environments, as may be found in some analysis or measurement devices.

In specific embodiments of the proposed two-axis rotator, there may be provision for the second hollow shaft to have an output gearing which is operationally connected to a drive gearing of the second rotor. In this embodiment, therefore, the drive gearing of the second hollow shaft which is operationally connected to the associated worm gear drive serves to drive the second hollow shaft relative to the base member and relative to the first rotor. The output gearing of the second hollow shaft which is in engagement with the drive gearing of the second rotor ensures that this rotational movement of the second hollow shaft is transmitted to the second rotor.

In specific embodiments of the proposed two-axis rotator, there may be provision for the output gearing of the second hollow shaft and the drive gearing of the second rotor to be bevel gears. This embodiment takes account of the fact that the second shaft end of the first rotor, or the second hollow shaft, is orientated parallel with the first rotation axis and consequently orthogonally with respect to the second rotation axis, about which the second rotor can be rotated.

For the mechanical functionality of the two-axis rotator, it is important to use a sufficiently strong material which is suitable for all components.

In an embodiment which is particularly suitable for specific applications, there is provision for specific components or all components of the two-axis rotator to be produced from a thermally and/or electrically non-conductive or insulating material. For other applications, it may in turn be advantageous for specific components or also all components of the two-axis rotator to be produced from a non-magnetic or non-magnetizable material.

In other embodiments, for specific components or also for all components of the two-axis rotator, metal material, for example, high-grade steel, aluminum, brass, titanium or copper, can advantageously be used.

For specific components or also for all components of the two-axis rotator, plastics material, for example, PEEK can advantageously be used in other embodiments.

In other embodiments, specific components or also all components of the two-axis rotator may be produced from sapphire, ceramic material or the like.

Individual components may, for example, be produced from various materials if the mechanical function and the requirements of the operating environment can thereby be reconciled.

In a particularly advantageous manner, all of the components of the two-axis rotator are produced from the same material. As a result of the reduction to one material, it is ensured that all fits remain independent of temperature and the functionality is thus also ensured at very high or very low temperatures.

The object according to the invention is also achieved with a handling apparatus, which has such a two-axis rotator. Such a handling apparatus may advantageously be used to handle material samples which are intended to be examined during the use of different analytical measurement methods, that is to say, to position material samples in space in the active region of scientific/technical analysis or measurement devices.

For example, the two-axis rotator may be arranged on a manipulator which is operationally connected to the drives of the first rotor and the second rotor.

In order also to enable a rotation about the third spatial direction, the proposed handling apparatus may be configured in such a manner that the two-axis rotator is rotatably arranged on the manipulator about a third rotation axis. In this instance, the rotation about the third spatial direction is produced in that the two-axis rotator is rotated on the whole about this third axis.

The object forming the basis of the invention is also achieved by an analysis apparatus for analyzing properties of an object to be examined in accordance with the orientation of the object to be examined relative to a predetermined field of a physical field variable, an energy radiation or the like. Such an analysis apparatus may, for example, comprise a field generation device and/or a radiation source and a two-axis rotator of the type described in order to position the object to be examined differently in the field generated or in the radiation generated by means of rotation about at least two spatial axes. Such an analysis apparatus may further comprise, for example, a temperature control device, for example, a furnace or a cryostat, wherein the two-axis rotator may be arranged in the temperature control device.

BRIEF DESCRIPTION OF THE DRAWINGS

The invention will be explained in greater detail below with reference to one embodiment and associated drawings, in which.

DETAILED DESCRIPTION

Figure 1:
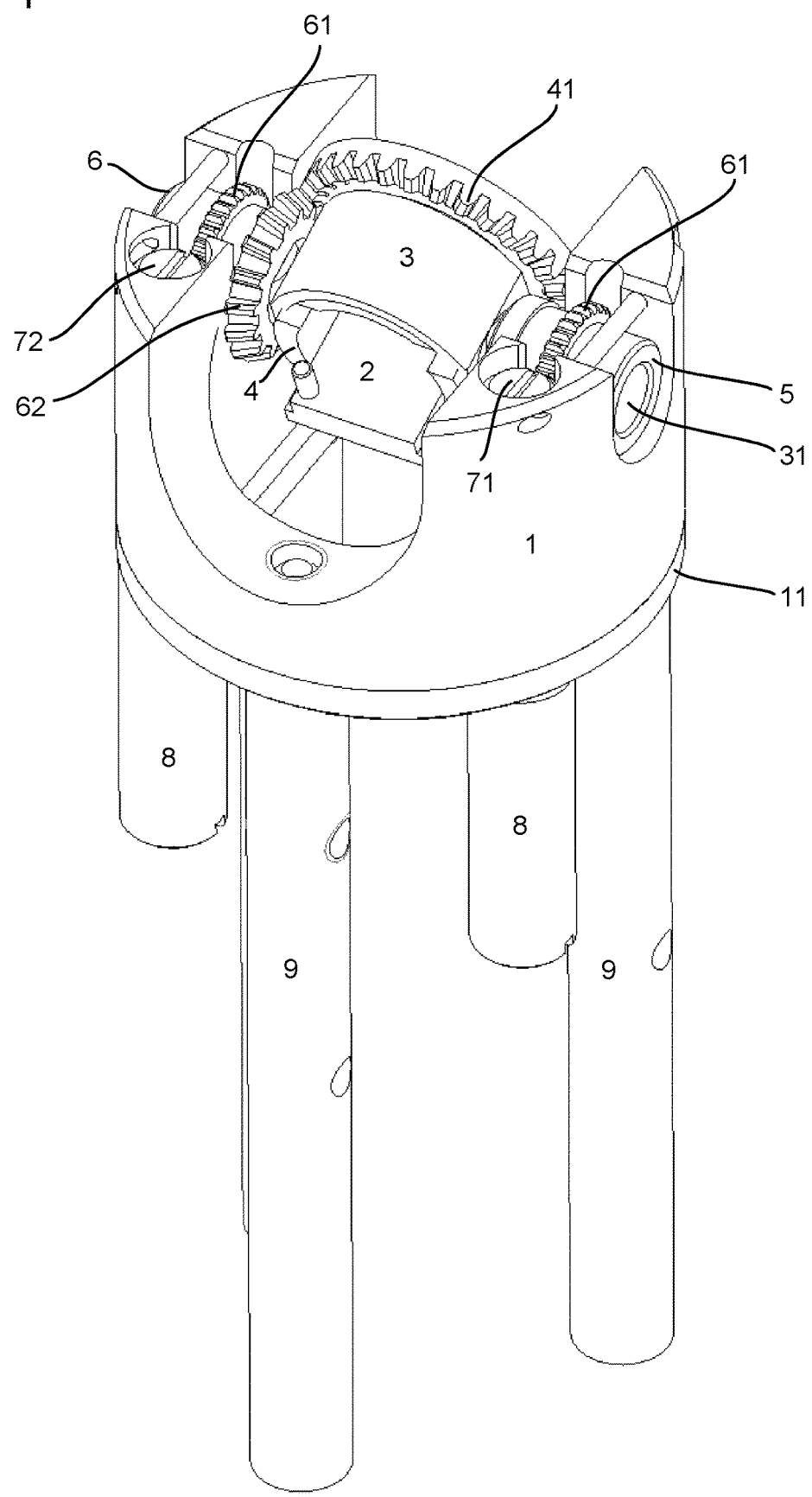
FIG. 1 shows an embodiment of the proposed two-axis rotator.
Figure 2:
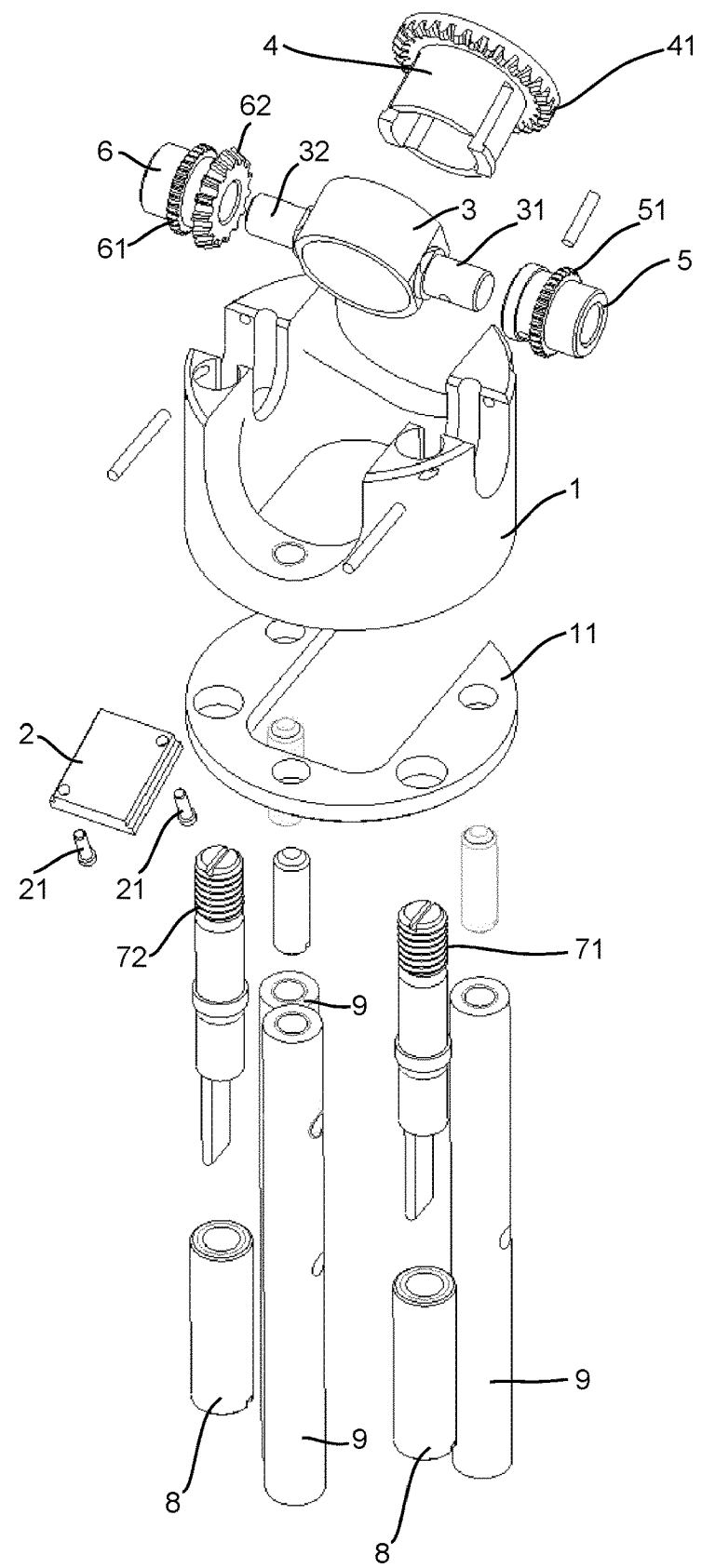
FIG. 2 shows an exploded illustration of the embodiment according to FIG. 1.

Three retention rods 9 of a handling device retain a base plate 11, to which a base member 1 is fitted. The first rotor 3 is rotatably supported in the base member 1 about a first rotation axis. The first rotor 3 has two concentric shaft ends 31, 32 which are arranged opposite each other and whose center axes define the first rotation axis. The second rotor 4 is rotatably supported in the first rotor 3 about a second rotation axis. The first rotor 3 has a cylindrical inner face and the second rotor 4 has a cylindrical outer face. The inner face of the first rotor 3 and the outer face of the second rotor 4 cooperate as rotary bearings and the center axes thereof define the second rotation axis.

At a first shaft end 31 of the first rotor 3, there is arranged in a rotationally secure manner a first hollow shaft 5 which has a drive gearing 51 which is operationally connected to a first worm gear drive 71 which is arranged in a sleeve 8.

The second shaft end 32 opposite the first shaft end 31 has a cylindrical outer face and a second hollow shaft 6 having a cylindrical inner face is arranged thereon. The inner face of the second hollow shaft 6 and the outer face of the second shaft end 32 cooperate as rotary bearings. The second hollow shaft 6 is rotatably supported in the base member 1 about the first rotation axis and the first rotor 3 is rotatably supported in the second hollow shaft 6 about the first rotation axis. The second hollow shaft 6 has a drive gearing 61 which is operationally connected to a second worm gear drive 72 which is arranged in a sleeve 8. The second hollow shaft 6 has an output gearing 62 which is operationally connected to a drive gearing 41 of the second rotor 4.

The first worm gear drive 71 and the second worm gear drive 72 are arranged parallel with each other and rotatably supported in a sleeve 8 in each case.

The specific feature of the invention involves the ability to simultaneously control two orthogonal rotation axes, whereby a precise orientation, for example, of sample materials to be examined, is enabled with respect to an exploratory axis which is produced, for example, by means of a technically generated magnetic field or an X-ray beam. Furthermore, the small structural size of the two-axis rotator enables use in extremely varied of apparatuses.

The two-axis rotator enables a relatively large sample (for example, 10×10×3 mm) to be rotated in a small structural space (for example, D=29 mm) about two orthogonal axes through 360° and more in each case. These axes are, on the one hand, independent in the drive and can when the bearing axis is driven completely compensate for the mutual influence by both axes being driven at the same speed and in the same direction.

This compensation is not intended to be understood to be readjustment, but instead leads to an instantaneous relative rotation about an axis which is located precisely in the desired direction. If both axes are driven at the same time, but at different speeds or different rotation directions or a combination of both, spatial rotations which depending on experiment requirements can be very advantageous are produced.

In the embodiment illustrated, all components with the exception of contact pins on the sample carrier were produced from PEEK (polyether ether ketone). The functionality and ease of operation of all the fits and bearings used under all the temperatures which may be anticipated, even in the cryogenic range, is thereby ensured. By using non-magnetic materials, the generation of magnetic stray fields is prevented during use in cryomagnets, this is indispensable for the successful use of particularly sensitive measurement methods, such as nuclear magnetic resonance. As a result of the high strength and low susceptibility to wear of PEEK, finer and nonetheless stable structures which thus enable a reduction in the size of the overall construction were able to be provided. As a result of this reduction in size, it was possible to comply with the requirement for a construction with a maximum diameter of 29 mm and at the same time to enable the use of samples of a size which would otherwise be reserved for constructions of a larger overall diameter.

As a result of the movement which is unlimited in terms of the angle, it is possible always to rotate the sample carrier when changing samples into a position which enables the sample to be readily changed.

The invention enables the independent, influence-compensated rotation of both orthogonal axes as a result of the construction of the bearing and the drive by means of concentric drive axes. These axes are redirected individually by means of an additional angle gear mechanism through 90°, which enables the installation in a sample space having a diameter of 30 mm.

By using a material for all the components, no different thermal expansion coefficients occur, which ensures the fits and bearing plays are maintained in all temperature ranges, even in the cryogenic range.

The changeable sample carrier affords significant advantages in equipping the rotator since these activities can only be carried out remotely from the rotator and thus a more precise sample positioning on the carrier is possible with at the same time reduced time expenditure.

For cryogenic applications, the construction should be produced from a non-conductive material. For the purely mechanical functionality, it is important to use a sufficiently strong material which is suitable for all components. With the reduction to one material, it is ensured that all fits are maintained regardless of temperature and thus ensure the function. For the application environment which is primarily envisaged, PEEK has been found to be a suitable material. For other application possibilities, however, it is also possible to produce the construction from other plastics materials or metal materials. Variants, for example, made of sapphire, are also conceivable. To this end, individual components made of different materials can be produced when the mechanical function and the requirements of the working environment can thereby be reconciled.

LIST OF REFERENCE NUMERALS

1 Base member
11 Base plate
2 Sample carrier
21 Contact pin
3 First rotor
31 First shaft end
32 Second shaft end
4 Second rotor
41 Drive gearing
5 First hollow shaft
51 Drive gearing
6 Second hollow shaft
61 Drive gearing
62 Drive gearing
71 First worm gear drive
72 Second worm gear drive
8 Sleeve
9 Retention rod

The invention claimed is:

1. A two-axis rotator for producing a rotation about two mutually orthogonal rotation axes, comprising
a base member, a first rotor and a second rotor, wherein the first rotor is rotatably supported in or on the base member about a first rotation axis and the second rotor is rotatably supported on or in the first rotor about a second rotation axis, and
wherein the first rotor has a first drive and the second rotor has a second drive, and the first drive and the second drive can be driven independently of each other, and
wherein the first rotor has a cylindrical inner face and the second rotor has a cylindrical outer face and the inner face and the outer face cooperate as rotary bearings, wherein center axes thereof define the second rotation axis.

2. The two-axis rotator as claimed in claim 1, wherein the first rotor has two concentric shaft ends which are arranged opposite each other and whose center axes define the first rotation axis.

3. The two-axis rotator as claimed in claim 2, wherein a first hollow shaft is arranged in a rotationally secure manner at a first shaft end.

4. The two-axis rotator as claimed in claim 3, wherein the shaft ends or the hollow shafts have a drive gearing in each case.

5. The two-axis rotator as claimed in claim 4, wherein the shaft ends or the hollow shafts or the drive gearings are operationally connected to a worm gear drive in each case.

6. The two-axis rotator as claimed in claim 5, wherein the worm gear drives are arranged parallel with each other.

7. The two-axis rotator as claimed in claim 2, wherein a second shaft end has a cylindrical outer face and a second hollow shaft having a cylindrical inner face is arranged on the second shaft end, wherein the inner face and the outer face cooperate as rotary bearings, wherein the second hollow shaft is rotatably supported on or in the base member about the first rotation axis and the first rotor is rotatably supported in the second hollow shaft about the first rotation axis.

8. The two-axis rotator as claimed in claim 7, wherein the second hollow shaft has an output gearing which is operationally connected to a drive gearing of the second rotor.

9. The two-axis rotator as claimed in claim 8, wherein the output gearing of the second hollow shaft and the drive gearing of the second rotor are bevel gears.

10. A handling apparatus having a two-axis rotator as claimed in claim 1.

11. The handling apparatus as claimed in claim 10, wherein the two-axis rotator is arranged on a manipulator which is operationally connected to the drives of the first rotor and the second rotor.

12. The handling apparatus as claimed in claim 11, wherein the two-axis rotator is rotatably arranged on the manipulator about a third rotation axis.

13. An analysis apparatus for analyzing properties of an object to be examined in accordance with an orientation of the object to be examined comprising a field generation device and/or a radiation source and a two-axis rotator as claimed in claim 1.

14. The analysis apparatus as claimed in claim 13, comprising a temperature control device, wherein the two-axis rotator is arranged in the temperature control device.

15. The two-axis rotator as claimed in claim 1, wherein the shaft ends have a drive gearing in each case.

* * * * *